US009378829B2

(12) United States Patent
Kalderon et al.

(10) Patent No.: US 9,378,829 B2
(45) Date of Patent: Jun. 28, 2016

(54) NON-VOLATILE MEMORY DEVICE WITH AN EPLI COMPARATOR

(71) Applicant: Cypress Semiconductor Corporation, San Jose, CA (US)

(72) Inventors: Ifat Nitzan Kalderon, Petach Tikva (IL); Max Steven Willis, III, Briarcliff, TX (US)

(73) Assignee: Cypress Semiconductor Corporation, San Jose, CA (US)

( * ) Notice: Subject to any disclaimer, the term of this patent is extended or adjusted under 35 U.S.C. 154(b) by 3 days.

(21) Appl. No.: 13/761,217

(22) Filed: Feb. 7, 2013

(65) Prior Publication Data

US 2014/0219018 A1    Aug. 7, 2014

(51) Int. Cl.
| | |
|---|---|
| *G06F 13/00* | (2006.01) |
| *G11C 16/10* | (2006.01) |
| *G11C 16/14* | (2006.01) |
| *G11C 16/22* | (2006.01) |
| *G11C 16/34* | (2006.01) |
| *G06F 3/06* | (2006.01) |
| *G06F 12/12* | (2016.01) |
| *G06F 13/22* | (2006.01) |
| *G06F 13/42* | (2006.01) |
| *G06F 12/02* | (2006.01) |

(52) U.S. Cl.
CPC .............. *G11C 16/102* (2013.01); *G11C 16/14* (2013.01); *G11C 16/225* (2013.01); *G11C 16/344* (2013.01); *G06F 3/061* (2013.01); *G06F 3/0628* (2013.01); *G06F 3/0679* (2013.01); *G06F 3/0688* (2013.01); *G06F 12/0238* (2013.01); *G06F 12/126* (2013.01); *G06F 13/225* (2013.01); *G06F 13/4295* (2013.01)

(58) Field of Classification Search
CPC ...... G06F 3/0679; G06F 3/0688; G06F 13/12; G06F 12/126; G06F 12/0238; G06F 13/225; G06F 13/4295
USPC .............. 711/103, 156, 163; 712/37; 713/340
See application file for complete search history.

(56) References Cited

U.S. PATENT DOCUMENTS

| | | | | |
|---|---|---|---|---|
| 5,898,618 | A * | 4/1999 | Lakkapragada et al. . | 365/185.22 |
| 6,058,044 | A * | 5/2000 | Sugiura et al. .......... | 365/185.17 |
| 7,161,850 | B2 * | 1/2007 | Shiga et al. .............. | 365/189.05 |
| 7,831,783 | B2 * | 11/2010 | Pandit et al. ............. | 711/159 |
| 8,359,427 | B2 * | 1/2013 | Sunaga ................... | 711/104 |
| 2004/0268021 | A1 * | 12/2004 | Larsen .................... | 711/103 |
| 2005/0144362 | A1 * | 6/2005 | Lin et al. ................ | 711/103 |
| 2007/0097750 | A1 * | 5/2007 | Shiga et al. ............. | 365/185.22 |
| 2007/0150645 | A1 | 6/2007 | Chandramouli et al. | |
| 2007/0258288 | A1 * | 11/2007 | Amidon et al. .......... | 365/185.17 |
| 2009/0070529 | A1 | 3/2009 | Mee et al. | |

(Continued)

OTHER PUBLICATIONS

International Search Report for corresponding PCT application PCT/IB2014/058829 mailed on Jul. 11, 2014.

*Primary Examiner* — Reba I Elmore

(74) *Attorney, Agent, or Firm* — Eitan, Mehulal & Sadot

(57) ABSTRACT

A non-volatile memory device comprising a memory cell array including memory cells distributed among a plurality of sectors; a controller operable to program, read, and erase memory cells in said memory array, said controller further operable to generate and store EPLI values for programming a number of EPLI bits in one of said plurality of sectors with said stored EPLI values; and a comparator to compare said stored EPLI values with EPLI values programmed in said EPLI bits.

30 Claims, 4 Drawing Sheets

(56) References Cited

U.S. PATENT DOCUMENTS

| | | | |
|---|---|---|---|
| 2009/0201734 A1* | 8/2009 | Salessi et al. | 365/185.11 |
| 2009/0204749 A1* | 8/2009 | Salessi et al. | 711/103 |
| 2010/0008175 A1 | 1/2010 | Sweere et al. | |
| 2010/0325350 A1* | 12/2010 | Sunaga | 711/103 |
| 2012/0033493 A1* | 2/2012 | Thiruvengadam et al. | 365/185.03 |
| 2012/0033495 A1* | 2/2012 | Kato | 365/185.05 |
| 2012/0117307 A1* | 5/2012 | Eguchi et al. | 711/103 |
| 2012/0317347 A1* | 12/2012 | Confalonieri et al. | 711/103 |
| 2013/0117496 A1* | 5/2013 | Lyubman | 711/103 |

* cited by examiner

NON-VOLATILE MEMORY DEVICE WITH AN EPLI COMPARATOR

FIELD OF THE INVENTION

The present invention relates to non-volatile memory devices generally and to non-volatile memory devices having improved blank checking in particular.

BACKGROUND OF THE INVENTION

Non-volatile memory devices such as, for example FLASH memory devices, may include an array of memory cells divided into a number of sectors. Each memory cell may have a gate, a source and a drain, where the gate controls current flow between the source and the drain. The amount of current flow generally depends on a voltage applied to the gate (gate voltage). If the gate voltage Vg is below a threshold voltage Vt which is intrinsic to the physical properties of the memory cell, there is no current flow (generally a leakage current exists) between the drain and the source. When the gate voltage exceeds the threshold voltage, current flows between the drain and the source, the amount of current depending on the magnitude of the applied gate voltage. The gate voltage Vg is generally adjusted to different values depending on whether the cell is to be programmed (write), erased or verified. When programming a cell, the gate voltage Vg is usually greater than when reading or erasing the cell.

A typical erasure operation for non-volatile memory devices may include the erase flow shown in FIG. 1. Erase flow 100 may include the steps of pre-program 102, erase 104, soft-program 106, non-data cell program 108, and erase completed 110. One or more of the steps may include an iterative process wherein one or more internal operations associated with the execution of a particular step is subject to a verification procedure. Based on the result of the verification procedure, the one or more operations may be repeated one or more times, and each time may be followed by the verification procedure. This iterative process may be repeated until the one or more operations are verified as being properly executed (by means of the verification procedure). Upon completion of the iterative process, the step may be considered completed and erase flow 100 may continue to the next step.

In pre-program step 102, a pre-program voltage may be applied to some or all the data cells in a sector so that all pre-programmed cells hold substantially the same charge (same data). For example, the data cells may be pre-programmed so that the bits in the cells are set to "0". The pre-program voltage may be applied substantially at the same time to all the cells in the sector, or in smaller subdivisions, for example, by page (cells connected to a same word line), or groups of cells within a page. Following pre-programming, in erase step 104 an erase voltage is applied to the pre-programed cells in the sector to erase the pre-programmed data. Erasing may be done to the cells substantially at the same time, for example, by applying the erase voltage to all the word lines in the same sector, or to a select group of word lines including the pre-programmed cells. As a result of the erasing, the bits in the erased data cells may be set to "1". In soft-program step 106, cells which may have been over-erased in the previous step are soft-programmed to increase the threshold voltage needed to indicate an erased state. Following the soft programming, all bits in the data cells remain set to "1". In non-data cell program step 108, non-data cells which may serve as reference cells may be programmed to a certain threshold voltage. The non-data cells may include dynamic reference cells to account for drift in the threshold voltages of the data cells. Following this step, all data bits in the erased sector remain set to "1". In erase completed step 110, the erasure operation is completed and the sector is ready for individual programming of the cells by a user of the non-volatile memory device.

SUMMARY OF THE PRESENT INVENTION

There is provided, according to an embodiment of the present invention, a non-volatile memory device comprising a memory cell array including memory cells distributed among a plurality of sectors; a controller operable to program, read, and erase memory cells in the memory array, the controller further operable to generate and store EPLI values, and to program a number of EPLI bits in one of the plurality of sectors with the stored EPLI values; and a comparator to compare the stored EPLI values with the EPLI values programmed in the EPLI bits.

According to an embodiment of the present invention, the controller is further operable to read the EPLI values programmed in the EPLI bits.

According to an embodiment of the present invention, the controller is further operable to output a signal responsive to the comparison performed by the comparator.

According to an embodiment of the present invention, the output signal is inidicative of the one of the plurality of sectors being a trusted sector.

According to an embodiment of the present invention, the output signal is inidicative of the one of the plurality of sectors being an untrusted sector.

According to an embodiment of the present invention, the memory device includes an I/O circuit to communicate the output signal to a device externally connected to the memory device.

According to an embodiment of the present invention, the comparator is included in the controller.

According to an embodiment of the present invention, the non-volatile memory cells are multi-level cells.

According to an embodiment of the present invention, the non-volatile memory cells are two-bit cells.

According to an embodiment of the present invention, the EPLI values include final EPLI values.

According to an embodiment of the present invention, the EPLI values include initial EPLI values.

According to an embodiment of the present invention, the initial EPLI values comprise a same logical value.

According to an embodiment of the present invention, the EPLI bits are stored in memory locations designated for ECC bits.

According to an embodiment of the present invention, the ECC bits are redundant bits.

According to an embodiment of the present invention, the number of EPLI bits includes at least two bits.

According to an embodiment of the present invention, the number of ELPI bits includes 48 bits.

There is provided, according to an embodiment of the present invention, a method of erasing a sector of non-volatile memory cells in a non-volatile memory device comprising generating and storing initial EPLI values and final EPLI values; programming EPLI bits inside the sector with the initial EPLI values; and executing a memory sector erase flow; wherein the memory sector erase flow includes at least the steps of memory cell pre-programming, erasing, and soft-programming.

According to an embodiment of the present invention, the method further comprises programming the EPLI bits with stored final EPLI values.

According to an embodiment of the present invention, the method further comprises reading the final EPLI values programmed in the EPLI bit.

According to an embodiment of the present invention, the method further comprises comparing the stored final EPLI values with the read final EPLI values.

According to an embodiment of the present invention, the method further comprises outputting a signal responsive to the comparison.

According to an embodiment of the present invention, the method further comprises outputting the signal to a device externally connected to the non-volatile memory device.

According to an embodiment of the present invention, the output signal is indicative of the sector being a trusted sector.

According to an embodiment of the present invention, the method further comprises performing a blank check on the trusted sector.

According to an embodiment of the present invention, the method further comprises skipping the trusted sector when a result of the blank check confirms that the sector has been erased.

According to an embodiment of the present invention, the output signal is indicative of the sector being an untrusted sector.

According to an embodiment of the present invention, the method further comprises executing the memory erase flow on the untrusted sector.

According to an embodiment of the present invention, the method further comprises memory sector erase flow further includes at least the non-data cell programming.

According to an embodiment of the present invention, the method further comprises initial EPLI values have a same logical value.

According to an embodiment of the present invention, the method further comprises memory erase flow sets all bits in the sector to a same logical value.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
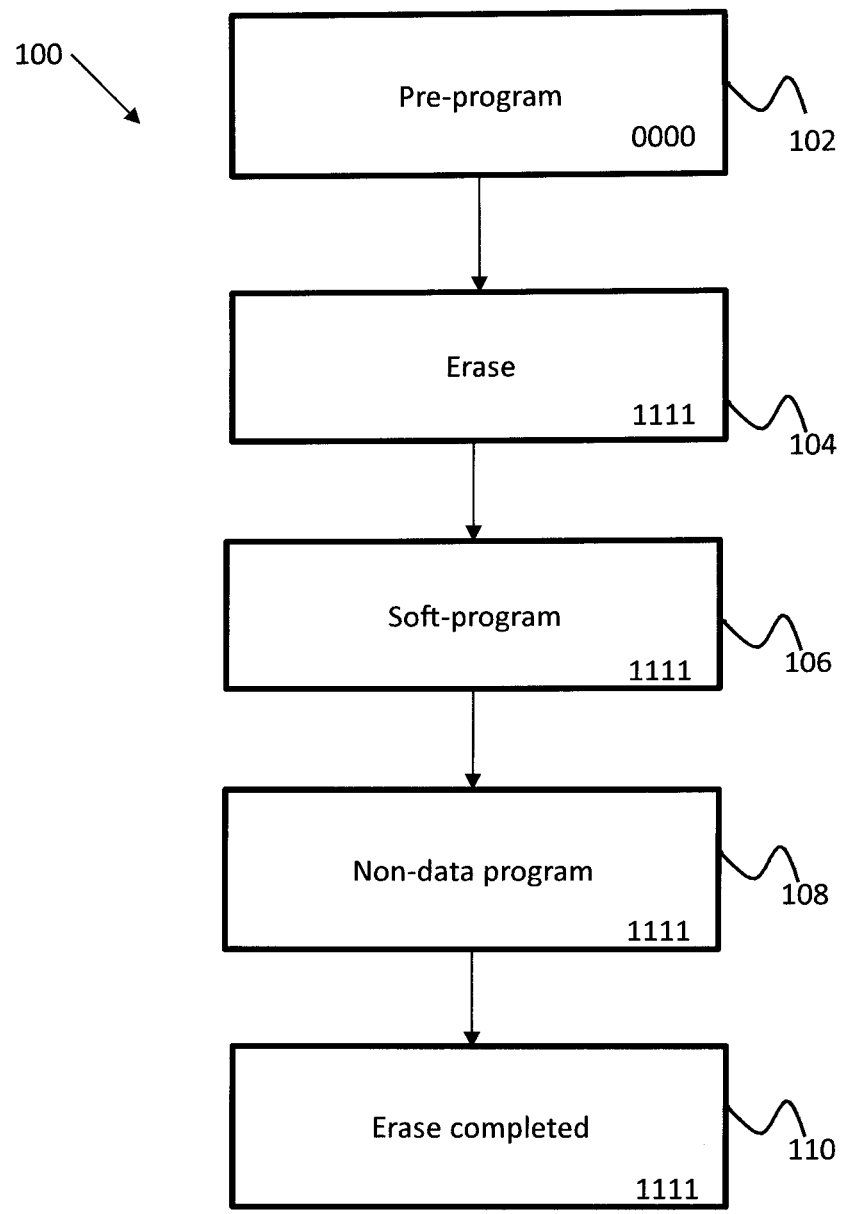
FIG. 1 illustrates an exemplary flow chart of an erase flow for non-volatile memory devices.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Blank checking is frequently used in non-volatile memory devices to determine if a sector is erased. For example, during a blank check all the bits in the sector may be read and if all are set to "1", the sector may be considered erased. Blank checking may be particularly useful as it may save "re-erasing" a sector which has already been erased, allowing a "blank checked" sector to be skipped over during an erasure process and thus saving time. Additionally, it may save performing an additional erase cycle which may contribute to an increase in the reliability of the memory device.

Applicants have realized that blank checks in non-volatile memories may be unreliable and sectors may be read as erased despite incompletion of an erasure operation. This may occur as a result of a power loss, a power reset, or some other type of failure during execution of an erase flow. For example, referring to the erase flow described in the Background and shown in FIG. 1, if power loss occurs following erase step 104, blank checking of the sector will read all the bits in the cells set to "1" and the sector will be skipped. Nevertheless, the additional steps of soft-programming (step 106) and non-data cell programming (step 108) were not performed and the erasure operation was not completed. Consequently, problems which may be typically remedied by the execution of the soft-programming step and/or the non-data cell programming step (e.g. leakage currents) may be encountered using the memory device when reading and/or writing into the skipped sector.

Figure 2:
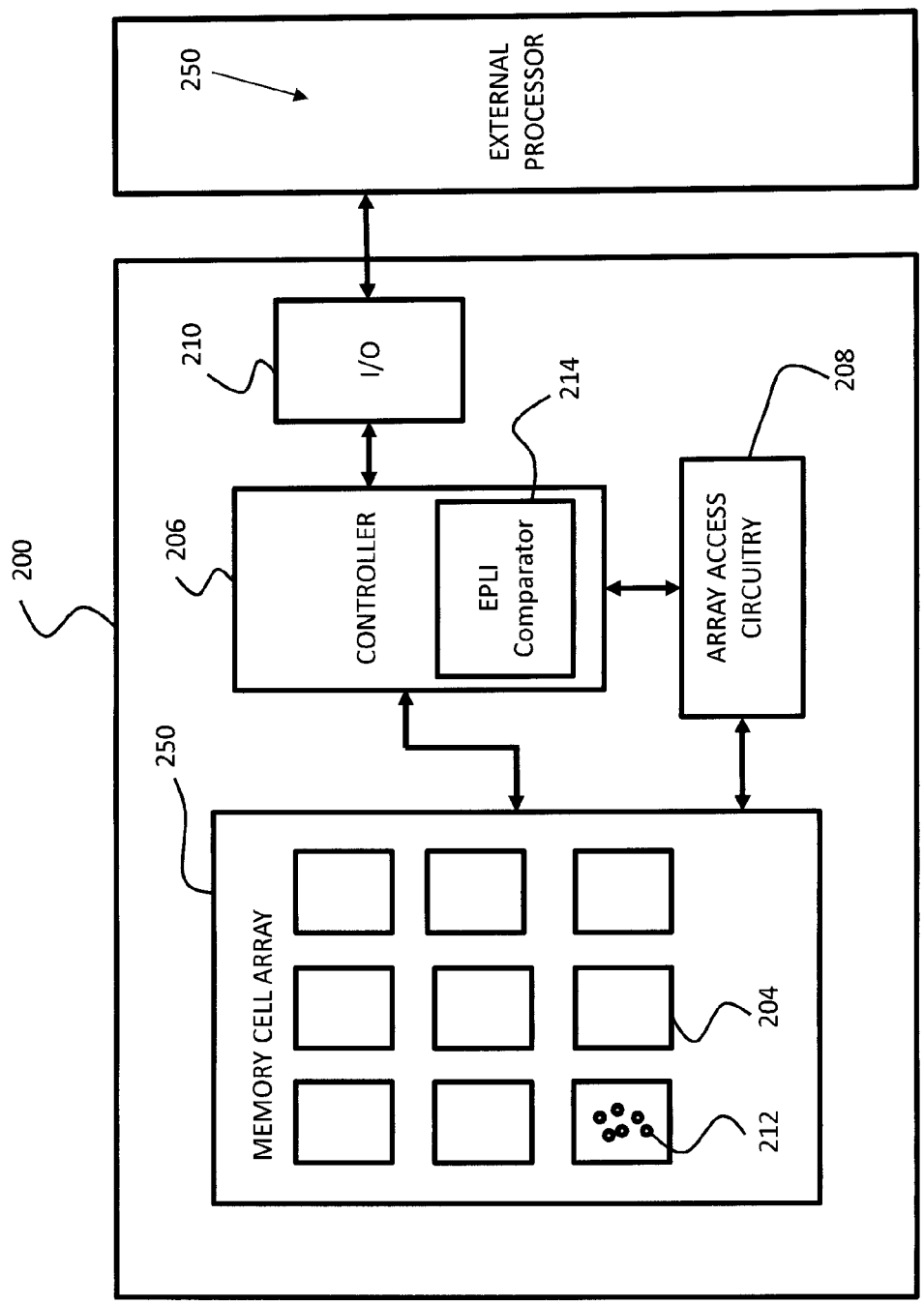
FIG. 2 schematically illustrates an exemplary improved non-volatile memory device, according to an embodiment of the present invention.

Applicants have devised a method for increasing the reliability of blank checks by detecting power losses, power resets, and other type of failures in the execution of an erase flow during a sector erasure operation. Increasing the reliability of the blank checks may result in an improved non-volatile memory device, for example, such as non-volatile memory device 200 shown in FIG. 2, according to an embodiment of the present invention. Memory device 200 includes a memory cell array 202, a controller 206, array access circuitry 208, and an I/O interface 210.

Memory cell array 202 may include a plurality of non-volatile memory cells equally distributed into sectors 204. The memory cells may be Mirrorbit® cells, NROM cells, or other type of floating gate memory cells, and may be configured to store one bit, or alternatively, more than one bit such as in multi-level memory cells, for example 2 bits, depending on memory device 200. These may include data bits and error correction code (ECC) bits, the number of ECC bits may be according to a predetermined ECC Syndrome programmed in controller 206. The bits may be arranged within sector 204 in pages, for example, pages of size 2 Kb (Kilobits), 4 Kb, or 8 Kb, although larger size and smaller size pages may be possible.

Controller 206 may manage all programming, reading, and erasing of the memory cells, responsive to commands which may be received through I/O interface 210 from an external processor 250, and/or commands internally programmed in the controller. Additionally, controller 206 may manage possible data flow between memory device 200 and external processor 250 through I/O interface 210. Accessing the memory cells for programming, reading, and erasing may be through array access circuitry 208 which may include sense amplifiers, decoders, and other applicable circuitry as may be required for performing these functions.

According to an embodiment of the present invention, controller 206 may generate a first and a second sequence of bit values (logic states "0" or "1") which may be used to program a select number of non-data bits 212 in each sector 204 during an erasure operation, prior to and following execution of an erase flow. For convenience hereinafter, the select number of bits may be referred to hereinafter as EPLI (erase power loss indicator) bits, and the first and second sequence of bit values as initial EPLI values and final EPLI values, respectively. Each erasure operation may be assigned a particular set of initial EPLI values and final EPLI values which may be stored by controller 206 to later correlate the stored EPLI values with the EPLI values programmed during an erasure operation. This correlation may serve to determine whether execution of an erase flow in the erasure operation was completed or a fault occurred during execution and the erase flow was not completed, as is described in an example further on below.

The EPLI values may be generated by controller 206 using any known method, for example, using a bit pattern generating algorithm, or by a user preprogramming the bit values into the controller, or a combination of both. It may be noted, that, although each erasure operation may be assigned its own particular set of EPLI values, it may be possible to use the same initial EPLI values for all erasure operations, which may simplify processing and reduce processing power.

According to an embodiment of the present invention, controller 206 may additionally read EPLI bits 212, and may include an EPLI comparator 214 to compare the final EPLI values stored in EPLI bits 212 during the last successful completion of an erase flow with stored final EPLI values for the last erasure operation performed, to determine whether or not execution of the erase flow in the last erasure operation performed was successfully completed. Alternatively, EPLI comparator 214 may be external to controller 206. Based on the result of the comparison, controller 206 may determine whether to execute a blank check or alternatively, to execute the erase flow during an erasure operation. Additionally or alternatively, controller 206 may set a flag (e.g. a bit "1" or "0") indicating a status of successful or unsuccessful completion of the erasure operation and indicative of whether the blank check may or may not be performed. Controller 206 may send through I/O interface 210 to external processor 250 an indication of the result of the comparison for further processing by the external processor.

As an example of the operation of controller 206, one may assume an erasure operation X is designated initial EPLI values "0000" and final EPLI values "0101", and an erasure operation Y is designated initial EPLI values "0000" and final EPLI values "1110".

During erasure operation X and following the erase flow, assuming that the erase flow was not interrupted and was completed, EPLI bits 212 are programmed with the final EPLI values "0101". Following termination of erasure operation X, controller 206 may read in EPLI bits 212 the programmed final EPLI values "0101" and compare them to the stored EPLI values for the same erasure operation, and will detect that the values are the same. Therefore erasure operation X was successfully completed and the result may be output by controller 206 through I/O interface 210, for example, by outputting an erasure success signal (e.g. a bit value of "1").

During erasure operation Y and following the erase flow, assuming that the erase flow was interrupted and was not completed, EPLI bits 212 are not programmed with the final EPLI values "1110". Instead, as the program was not finished, EPLI bits 212 still contain the final EPLI values from erasure operation X ("0101"). Following termination of erasure operation Y, controller 206 may read in EPLI bits 212 the programmed final EPLI values "0101" and compare them to the stored EPLI values "1110" for erasure operation Y, and will detect that the values are different. Therefore erasure operation Y was not successfully completed and the result may be output by controller 206 through I/O interface 210, for example, by erasure fault signal (e.g. a bit value of "0").

According to an embodiment of the present invention, a number of EPLI bits 212 programmed by controller 206 may be pre-determined by a user of memory device 200. This number may be influenced by a user's requirement regarding a probability that the ELPI bit values read are correct, increasing a reliability of the validity of the comparison performed by EPLI comparator 214. For example, the number of EPLI bits 212 in each sector may be 2 bits, 4 bit, 8 bits, 12 bits, 20 bits, 32 bits, 48 bits, or more, wherein a greater number of EPLI bits used reduces a bit error rate (BER) and increases the reliability. That is, the greater number of EPLI bits 212 selected in each sector 204 increases the probability that the read EPLI values are correct. For example, selecting 48 EPLI bits 212 per sector 204 may result in a BER of $3.5e^{-15}$ compared to 0.25 for 2 EPLI bits.

According to an embodiment of the present invention, EPLI bits 212 may include use of unused array memory cells in memory array 202, which may substantially limit adding memory cells to the memory array for the EPLI bits, if required at all. For example, the ELPI bits may use ECC bits which may be designated as "redundant" bits. This may be particularly advantageous as the area of the die of memory device 200 may require a size increase to substantially accommodate only component changes required for programming ELPI bits 212 during the erasure operation, prior to and following execution of the erase flow; for reading the ELPI bits 212; and for comparing the read ELPI values with the predetermined values. For example, the component changes may be reflected by a possible increase in the size of the circuitry of controller 206 to accommodate EPLI comparator 214 and possible write RAM, among other minor logic circuitry modifications. To increase reliability, each EPLI bit 212 may be selected from a different memory cell within a sector 204, although a skilled person may realize that two or more EPLI bits may be selected from a same memory cell capable of storing more than one bit.

The availability of redundant bits for use as an ELPI bit may depend on whether the memory cells are single bit cells or multiple bit cells. For example, using an ECC for 128 bits, only 8 bits are required for the ECC syndrome and 1 bit is required as for program-over-program operations. This makes a total of 9 bits required for ECC. If the memory cells are two-bit cells, then one bit will be redundant and this bit may be used as EPLI bits 212.

Figure 3:
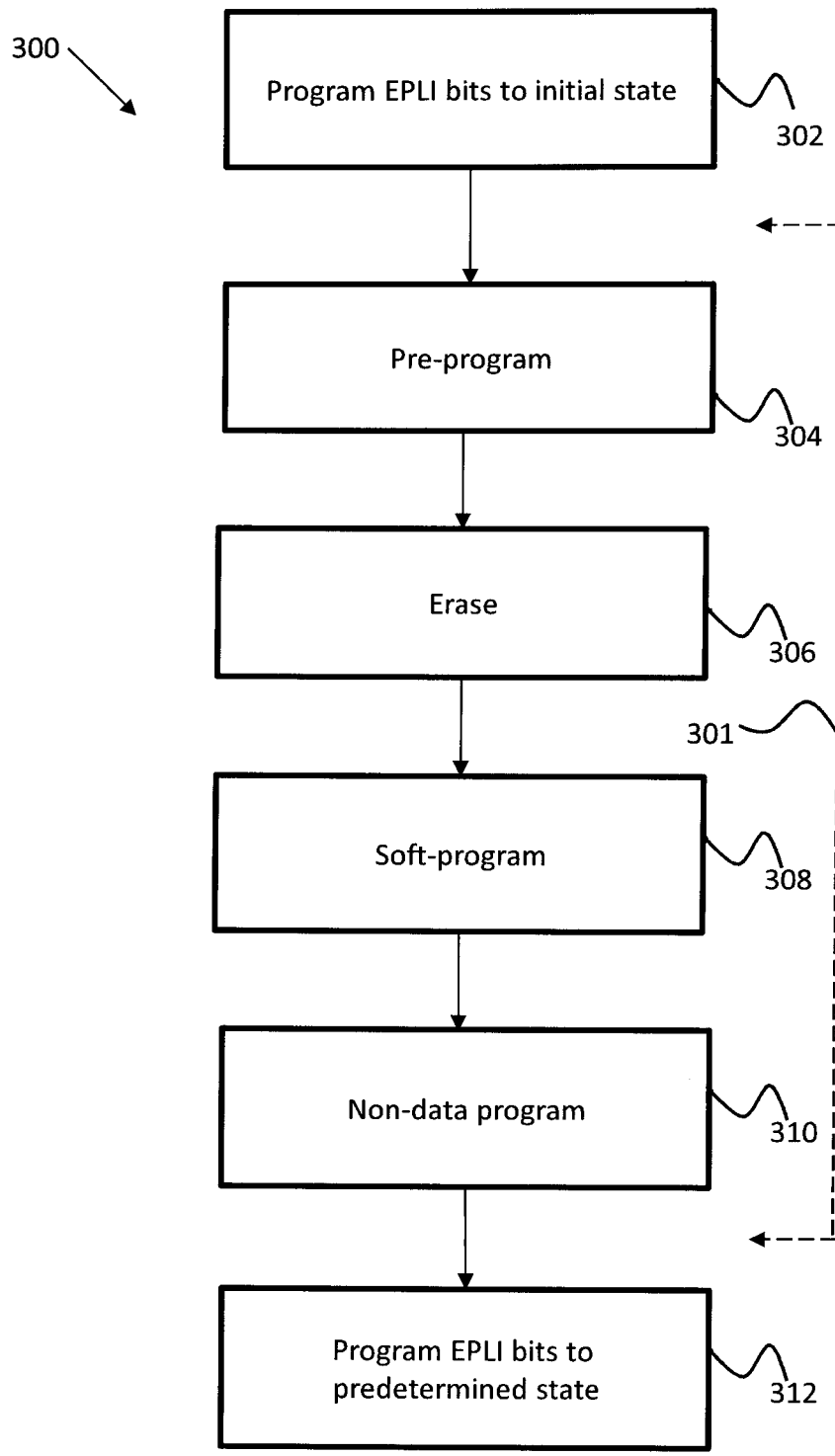
FIG. 3 is an exemplary flow chart of an EPLI erase flow which may be used with a non-volatile memory device, according to an embodiment of the present invention.

Reference is now made to FIG. 3 which is an exemplary flow chart of an EPLI erase flow 300 which may be used with non-volatile memory device 200, according to an embodiment of the present invention. EPLI erase flow 300 may include a program EPLI bits to initial state step 302, a pre-program step 304, an erase step 306, a soft-program step 308, a non-data cell program step 310, and a program EPLI bits to predetermined state step 312. Steps 304-310 are enveloped within an erase flow 301. Erase flow 301 may be the same program as known erase flow 100 previously described in the Background and shown in FIG. 1, so that steps 304-310 may be the same as steps 102-108 in erase algorithm 100.

In a fashion similar to erase flow 100, one or more of steps 302-312 may include an iterative process wherein one or more internal operations associated with the execution of a particular step is subject to a verification procedure. Based on the result of the verification procedure, the one or more operations may be repeated one or more times, and each time may be followed by the verification procedure. This iterative process may be repeated until the one or more operations are verified as being properly executed (by means of the verification procedure). Upon completion of the iterative process, the step may be considered completed and EPLI erase flow 300 may continue to the next step.

The following description of EPLI program 300 is described with reference to non-volatile memory device 200 for clarity purposes.

At 302, EPLI bits 212 may be programmed by controller 206 with the predetermined initial EPLI values. The initial EPLI values may be the same for all EPLI bits 212, or may include a combination of different values (different logical states). For example, all initial EPLI bits 212 may be set to "0" (same value for all EPLI bits), or some may be set to "0" and others to "1" (combination of logic states). Controller may program EPLI bits 212 so that the same initial EPLI values are used each time EPLI erase flow 300 is executed. For example, every time that EPLI program is executed in non-volatile memory device 200, the initial EPLI values are always set to "0" by controller 206. Alternatively, controller 206 may generate a different combination of initial EPLI values each time EPLI erase flow 300 is executed.

At 304, a pre-program voltage may be applied to all the memory cells in sector 204 for programming all the bits in the sector, excluding the previously programmed EPLI bits 212, to a "0" logic state. Execution of step 304 may be similar to step 102 in erase flow 100. If EPLI bits 212 are all programmed to an initial EPLI value of "0", it may be possible to skip step 302 and to program the EPLI bits in this step.

At 306, an erase voltage may be applied to all the memory cells in sector 204, including EPLI bits 212, to erase all the data in the memory cells, setting all bit values in the cells to logic state "1". Execution of step 306 may be similar to step 104 in erase flow 100.

At 308, soft-programming of the memory cells which may have been over-erased may be performed, including EPLI bits 212. Execution of step 308 may be similar to step 106 in erase flow 100, all bits remaining set to "1".

At 310, programming of the non-data cells may be performed. Execution of step 310 may be similar to step 108 in erase flow 100, all bits remaining set to "1".

At 312, EPLI bits 212 are programmed by controller 206 to the final EPLI values, which may include a combination of logic states "0" and "1". The final EPLI values may vary each time EPLI erase flow 300 is executed so that two sequential executions of the erase flow use different final EPLI values.

A person skilled in the art may realize that erase flow 301 described above may not necessarily be limited to steps 304-310 and may include other steps which may be performed by erase flows known in the art. The skilled person may further realize that method described by EPLI erase flow 300 above may be implemented in some embodiment having more steps, less steps, or having a different sequence of steps, or any combination thereof.

Figure 4:
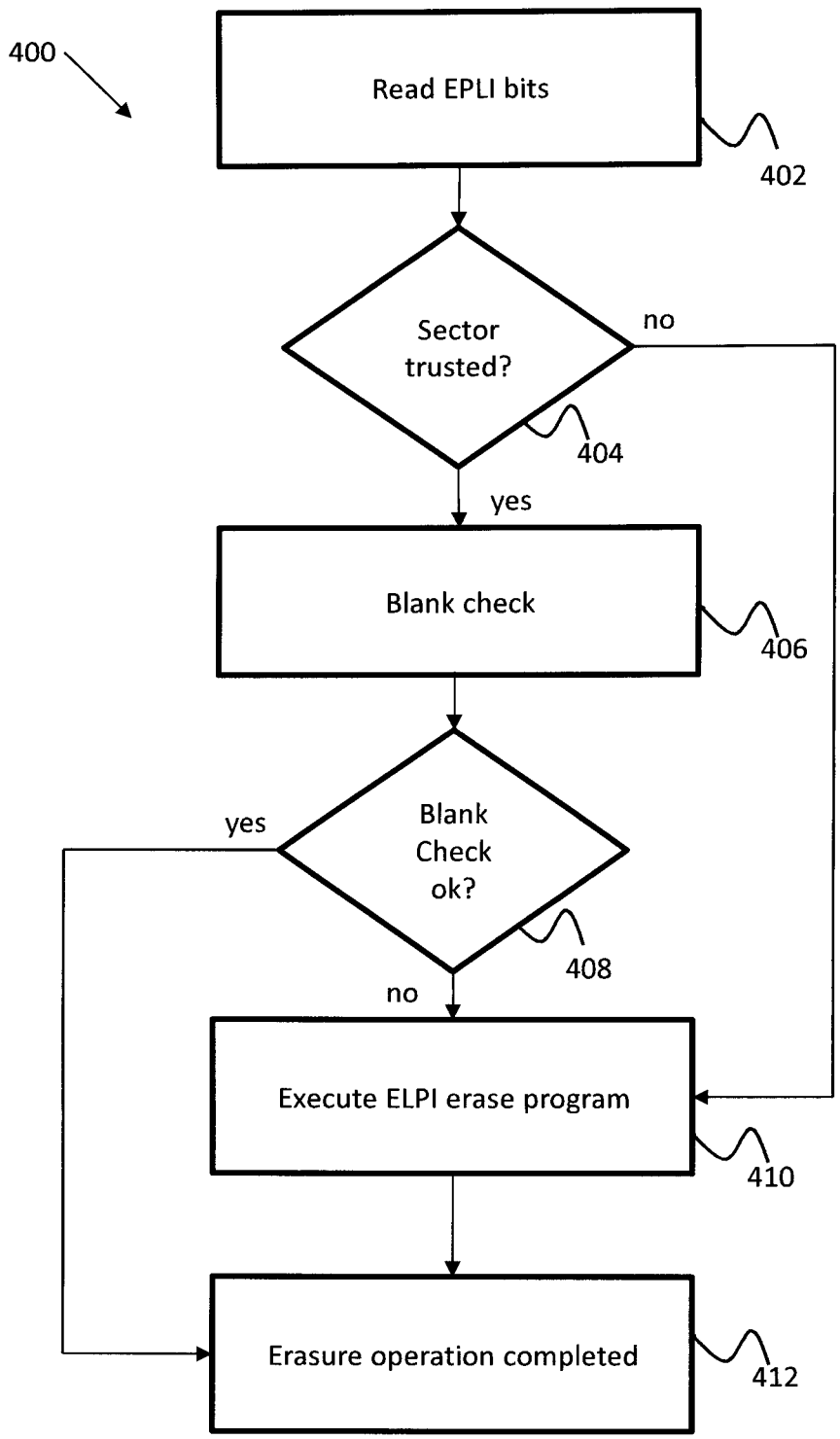
FIG. 4 is an exemplary flow chart of an EPLI erasure operation used in a non-volatile memory, according to an embodiment of the present invention.

Reference is now made to FIG. 4 which is an exemplary flow chart of an EPLI erasure operation 400 used in non-volatile memory 200, according to an embodiment of the present invention. The following description of EPLI erasure operation 400 is described with reference to non-volatile memory device 200 for clarity purposes.

At 402, controller 206 may read the final EPLI values stored in EPLI bits 212.

At 404, EPLI comparator 214 may compare the read final EPLI values with final EPLI values stored in controller 206 for the previous erasure operation performed. If the read final EPLI values are the same as the stored final EPLI values, sector 204 may be regarded as a "trusted" sector, that is, erase flow 300 was completed; continue to 406. If the read final EPLI values are not the same as the stored final EPLI values, sector 204 may not be regarded as a "trusted" sector; go to 410.

At 406, sector 204 is trusted and blank checking of the sector may be performed.

At 408, the result of the blank check is analyzed. If the blank check is OK, for example all memory cells in sector 204 store a bit of value "1", then erasing of the sector may be skipped; go to 412. If the blank check is not OK, continue to 410.

At 410, EPLI program 300 in FIG. 3 may be executed and, upon completing execution, continue to 412.

At 412, sector 204 in non-volatile memory 200 is erased; erasure operation 400 is completed.

A person skilled in the art may realize that method 400 may be implemented in other embodiment having more steps, less steps, or having a different sequence of steps, or any combination thereof.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory device comprising:
    a memory cell array including memory cells distributed among a plurality of sectors;
    a controller operable to program, read, and erase memory cells in said memory array, said controller further operable to generate and store erase power loss indicator (EPLI) values associated with an erasure operation in a sector of said plurality of sectors, and to program a number of EPLI bits in said sector with said stored EPLI values; and
    a comparator to compare said stored EPLI values with EPLI values programmed in said EPLI bits during a last successful erasure operation, and to provide an indication of whether or not said erasure operation in said sector is completed.

2. The non-volatile memory device of claim 1 wherein said controller is further operable to read said EPLI values programmed in said EPLI bits.

3. The non-volatile memory device of claim 1 wherein said controller is further operable to output a signal responsive to the comparison performed by said comparator.

4. The non-volatile memory device of claim 3 wherein said output signal is indicative of said one of said plurality of sectors being a trusted sector.

5. The non-volatile memory device of claim 3 wherein said output signal is indicative of said one of said plurality of sectors being an untrusted sector.

6. The non-volatile memory device of claim 3 including an I/O circuit to communicate said output signal to a device externally connected to the memory device.

7. The non-volatile memory device of claim 1 wherein said comparator is included in said controller.

8. The non-volatile memory device of claim 1 wherein said non-volatile memory cells are multi-level cells.

9. The non-volatile memory device of claim 1 wherein said non-volatile memory cells are two-bit cells.

10. The non-volatile memory device of claim 1 wherein said EPLI values include final EPLI values.

11. The non-volatile memory device of claim 1 wherein said EPLI values include initial EPLI values.

12. The non-volatile memory device of claim 10 wherein said initial EPLI values comprise a same logical value.

13. The non-volatile memory device of claim 1 wherein said EPLI bits are stored in memory locations designated for ECC bits.

14. The non-volatile device of claim 11 wherein said ECC bits are redundant bits.

15. The non-volatile device of claim 1 wherein said number of EPLI bits includes at least two bits.

16. The non-volatile device of claim 1 wherein said number of ELPI bits includes 48 bits.

17. A method of erasing a sector of non-volatile memory cells in a non-volatile memory device comprising:
   generating and storing EPLI values associated with an erasure operation in the sector;
   programming EPLI bits inside the sector with said EPLI values; and
   comparing said stored EPLI values with EPLI values programmed in said EPLI bits during a last successful erasure operation, and providing an indication of whether or not said erasure operation in the sector is completed.

18. The method of claim 17 further comprising programming said EPLI bits with stored final EPLI values.

19. The method of claim 17 further comprising-executing a memory sector erase flow comprising at least the steps of memory cell pre-programming, erasing, and soft programming.

20. The method of claim 17 wherein said stored EPLI values comprise final EPLI values.

21. The method of claim 17 further comprising outputting a signal responsive to said comparison.

22. The method of claim 21 further comprising outputting said signal to a device externally connected to the non-volatile memory device.

23. The method of claim 21 wherein said output signal is indicative of the sector being a trusted sector.

24. The method of claim 23 further comprising performing a blank check on the trusted sector.

25. The method of claim 24 further comprising skipping the trusted sector when a result of said blank check confirms that the sector has been erased.

26. The method of claim 21 wherein said output signal is indicative of said sector being an untrusted sector.

27. The method of claim 19 further comprising executing said memory erase flow on an untrusted sector.

28. The method of claim 19 wherein said memory sector erase flow further includes the step of non-data cell programming.

29. The method of claim 19 wherein said initial EPLI values have a same logical value.

30. The method of claim 19 wherein executing said memory erase flow sets all bits in the sector to a same logical value.

* * * * *